United States Patent
Sato et al.

(10) Patent No.: US 7,954,690 B2
(45) Date of Patent: Jun. 7, 2011

(54) INKJET PRINT HEAD, INKJET PRINT HEAD MANUFACTURING METHOD AND INKJET PRINT HEAD MOUNTING TOOL

(75) Inventors: Osamu Sato, Takasaki (JP); Shuzo Iwanaga, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 424 days.

(21) Appl. No.: 12/136,742

(22) Filed: Jun. 10, 2008

(65) Prior Publication Data

US 2008/0309730 A1 Dec. 18, 2008

(30) Foreign Application Priority Data

Jun. 12, 2007 (JP) .................. 2007-155360

(51) Int. Cl.
B23K 1/06 (2006.01)
B23K 31/02 (2006.01)

(52) U.S. Cl. .................. 228/110.1; 228/180.21

(58) Field of Classification Search .................. None
See application file for complete search history.

(56) References Cited

U.S. PATENT DOCUMENTS

| | | | | |
|---|---|---|---|---|
| 4,635,073 A * | 1/1987 | Hanson | .................. | 347/50 |
| 5,227,812 A * | 7/1993 | Watanabe et al. | .................. | 347/50 |
| 5,428,382 A * | 6/1995 | Shimosato et al. | .................. | 347/71 |
| 5,505,364 A * | 4/1996 | Plesinger | .................. | 228/121 |
| 5,924,197 A * | 7/1999 | Murakami et al. | .................. | 29/890.1 |
| 6,397,465 B1 * | 6/2002 | Akhavain et al. | .................. | 29/890.1 |
| 6,983,539 B2 * | 1/2006 | Akhavain et al. | .................. | 29/890.1 |
| 7,198,357 B2 * | 4/2007 | Tanikawa | .................. | 347/61 |
| 7,467,468 B2 * | 12/2008 | Imai | .................. | 29/890.1 |
| 7,536,762 B2 * | 5/2009 | Imai et al. | .................. | 29/25.35 |
| 7,562,428 B2 * | 7/2009 | Shinkai | .................. | 29/25.35 |
| 2002/0030715 A1 * | 3/2002 | Takata et al. | .................. | 347/37 |
| 2002/0051035 A1 * | 5/2002 | Suzuki | .................. | 347/50 |
| 2002/0089567 A1 * | 7/2002 | Sato et al. | .................. | 347/50 |
| 2003/0088981 A1 * | 5/2003 | Le et al. | .................. | 29/890.1 |
| 2003/0130841 A1 * | 7/2003 | Bangalore et al. | .................. | 704/231 |
| 2004/0060969 A1 * | 4/2004 | Imai et al. | .................. | 228/180.21 |
| 2005/0162474 A1 * | 7/2005 | Han | .................. | 347/50 |
| 2006/0012651 A1 * | 1/2006 | Lee et al. | .................. | 347/86 |
| 2006/0027623 A1 * | 2/2006 | Yanagisawa | .................. | 228/4.5 |
| 2006/0050109 A1 * | 3/2006 | Le et al. | .................. | 347/47 |
| 2006/0065701 A1 * | 3/2006 | Kobayashi | .................. | 228/193 |
| 2006/0132545 A1 * | 6/2006 | Tanikawa | .................. | 347/61 |
| 2006/0213955 A1 * | 9/2006 | Watanabe | .................. | 228/174 |

(Continued)

FOREIGN PATENT DOCUMENTS

JP 2001-134916 5/2001

(Continued)

*Primary Examiner* — Kiley Stoner

(74) *Attorney, Agent, or Firm* — Canon USA Inc IP Division

(57) ABSTRACT

An inkjet print head for which an ink flow path formation member, arranged on a printing element board, is prevented from being peeled off or being damaged, and the printing element board in an appropriate state can be mounted on a support member. According to the present invention, an ink flow path formation member is arranged on one face of a printing element board, and a peripheral area extending outward from the ink flow path formation member is prepared. Since pressure is applied to the peripheral area using a mounting tool, to bond the first terminals of the printing element board to the electrode terminals of the support member, damage to the ink flow path formation member, caused by the mounting tool, can be prevented.

5 Claims, 10 Drawing Sheets

U.S. PATENT DOCUMENTS

| | | | |
|---|---|---|---|
| 2006/0226200 A1* | 10/2006 | Banno et al. | 228/101 |
| 2007/0000974 A1* | 1/2007 | Kubo | 228/180.21 |
| 2007/0187457 A1* | 8/2007 | Minamitani et al. | 228/1.1 |
| 2007/0195137 A1* | 8/2007 | Morita | 347/85 |
| 2008/0087708 A1* | 4/2008 | Ozaki et al. | 228/1.1 |
| 2008/0143787 A1* | 6/2008 | Shimazu et al. | 347/50 |
| 2008/0265003 A1* | 10/2008 | Kainuma et al. | 228/110.1 |
| 2009/0078740 A1* | 3/2009 | Silverbrook et al. | 228/4.5 |

FOREIGN PATENT DOCUMENTS

| | | |
|---|---|---|
| JP | 2004-336071 | 11/2004 |
| JP | 2005-032944 | 2/2005 |
| JP | 2006-056243 | 3/2006 |

\* cited by examiner

INKJET PRINT HEAD, INKJET PRINT HEAD MANUFACTURING METHOD AND INKJET PRINT HEAD MOUNTING TOOL

BACKGROUND OF THE INVENTION

1. Field of the Invention

The present invention relates to an inkjet print head for ejecting ink, a manufacturing method for the inkjet print head, and an inkjet print head mounting tool employed for the manufacturing method.

2. Description of the Related Art

A method that employs an electro-thermal converting element is one of the typical ink ejection methods used for inkjet print heads employed for inkjet printing apparatuses.

For this type of inkjet printing apparatus, a technique disclosed in Japanese Patent Laid-Open No. 2006-056243 provides for an electrical connection to be established between an electric wiring member and a terminal to be connected to an electro-thermal converting element.

In the inkjet printing head disclosed in Japanese Patent Laid-Open No. 2006-056243, a flexible wiring member, which serves as a support member, is arranged under a printing element board on which nozzles are formed. For this arrangement, first and second wiring layers are formed, using copper foil patterning, on respective sides of the flexible wiring member, which is made of a polyimide resin base film. Then, bumps are formed on electrode terminals formed by the first wiring layer of the flexible wiring member, and the printing element board and the flexible wiring member are electrically connected by bonding the bumps to electrodes on the reverse face of the printing element board. Thus, electric power, and the electric signals that are required to control the ejection of ink, can be transmitted from the flexible wiring member to the printing element board.

A manufacturing process that prevents an IC chip from being scratched while being mounted is disclosed in Japanese Patent Laid-Open No. 2001-134916.

FIG. 10 is a diagram illustrating this IC chip manufacturing process. An IC chip 12 is a bare chip, across the entire surface of which, opposite a connection electrode bearing surface, a protective metal or resin layer 19 has been laminated. Arranged on the bottom of the IC chip 12 are bumps 45, which were previously formed on connection electrodes (not shown) using Au balls. On a flexure member 13 made of a stainless steel plate, a thin film pattern has been formed, using the same well known patterning method as used for fabricating a printed circuit, such as a flexible printed circuit (FPC), on a thin metal board.

The bumps 45 on the IC chip 12 and the flexure 13 are bonded together in the following manner. First, an ultrasonic attraction head 46, called a nozzle, is pressed against the surface of the IC chip 12, and the IC chip 12 is held (picked up) and is positioned at a connection pad portion (not shown) of an Au layer 44. Then, the IC chip 12 is pressed down, in the direction indicated by an arrow 47, until the Au ball bumps 45 on the IC chip 12 contact connection pads 44 on the thin film pattern. Subsequently, an ultrasonic wave, which vibrates as indicated by an arrow 48 (laterally), is applied to the IC chip 12 via the nozzle 46. When a predetermined pressure (a load) and the ultrasonic vibration are applied in this manner, the Au ball bumps 45 of the IC chip 12 and the connection pads (not shown) on the Au layer 44 are bonded together by fusion within a short period of time.

Furthermore, in Japanese Patent Laid-Open No. 2005-032944, a technique is disclosed whereby ultrasonic vibration is used to cause an electronic part held by a print head to reciprocate horizontally, so that the electronic part is bonded to a board under pressure.

Recently, demands have increased for inkjet printing apparatuses that have reduced prices, are more compact, and provide multicolor printing. In response to these demands, improvements are also being sought in the arrangements and the manufacturing methods used for inkjet print heads.

A technique for the pressure-bonding of electronic parts to a board using ultrasonic vibration is also disclosed in Japanese Patents Laid-Open Nos. 2004-336071 and 2005-032944, described above. The bonding technique that employs ultrasonic vibration can reduce bonding periods, compared with the bonding technique that employs an adhesive or solder, and is an effective means for reducing the manufacturing costs for inkjet print heads. Thus, the bonding technique using ultrasonic vibration, disclosed in Japanese Patent Laid-Open No. 2005-032944, can be usefully applied for the bonding of flow path formation members to flexible wiring members, which serve as support members, for an inkjet print head described in Japanese Patent Laid-Open No. 2006-056243.

However, according to the bonding technique that employs ultrasonic vibration, described in Japanese Patent Laid-Open Nos. 2004-336071 and 2005-032944, an electronic part might be scratched when the electronic part is reciprocated horizontally by ultrasonic vibration. Therefore, in a case wherein the ultrasonic bonding technique is applied to bond the nozzle formation member to the wiring member of an inkjet print head described in Japanese Patent Laid-Open No. 2006-056243, the orifice surface of the nozzle formation member would be scratched, and wettability of the orifice surface relative to ink would be changed, so that the ejection direction might be deviated.

In Japanese Patent Laid-Open No. 2001-134916, a proposal is provided for the formation of a protective layer on the reverse face of a chip to prevent the chip being scratched due to contact with an ultrasonic nozzle. Therefore, the protective layer forming technique described in Japanese Patent Laid-Open No. 2001-134916 may be applied for an inkjet print head described in Japanese Patent Laid-Open No. 2006-056243, and then, ultrasonic bonding may be performed. That is, a protective layer may be formed on one face of an ink flow path formation member described in Japanese Patent Laid-Open No. 2006-056243, and the ink flow path formation member may then be bonded to an electrical wiring board by pressing an ultrasonic nozzle against the protective layer on the ink flow path formation member. Using this method, damage to the ink flowpath formation member can be reduced.

However, the inkjet print head wherein an ink flow path member is formed on the printing element board is so designed that an adhesive layer is located between the printing element board and the ink flow path formation member, and therefore, with the adhesive layer, the adhesiveness of the two members is increased and this can hinder or prevent the ink flow path formation member from being peeled off easily. Therefore, when ultrasonic vibration is applied to the printing element board by the ultrasonic nozzle, via the ink flow path member, some minute peeling, such that an interference pattern can be observed, could occur between the printing element board and the ink flow path formation member.

SUMMARY OF THE INVENTION

The present invention is directed to an inkjet print head, for which an ink flow path formation member, arranged on a printing element board, is prevented from being peeled off or being damaged, and the printing element board, in an appropriate condition can be mounted on a support member. The present invention is also directed to a manufacturing method for the inkjet print head and an inkjet head mounting tool, which is employed for the manufacturing method.

According to a first aspect of the invention, an inkjet print head includes a printing element board which has two opposite faces, one face of the two faces being provided with an area in which an ink flow path formation member, having ink ejection orifices, is arranged and provided with a peripheral area around the ink flow path formation member, and the other face being provided with a first terminal portion; and a support member which has a second terminal portion electrically connected to the first terminal portion, the support member supporting the printing element board from the other face, the supporting member having the second terminal portion at a portion opposite the peripheral area.

According to a second aspect of the invention, a manufacturing method for an inkjet print head includes providing a printing element board which has two opposite faces, one face of the two faces being provided with an area in which an ink flow path formation member, having ink ejection orifices, is arranged and provided with a peripheral area around the ink flow path formation member, and the other face being provided with a first terminal portion; providing a support member, which has a second terminal portion electrically connected to the first terminal portion, to support the printing element board from the reverse face, the supporting member having the second terminal portion at a portion opposite the peripheral area; arranging the printing element board and the support member so that the first terminal and the second terminal are electrically connected together; and bonding the first terminal and second terminal together while a pressure member presses the peripheral area toward the supporting member.

According to a third aspect of the invention, an inkjet print head mounting tool for mounting, on a support member, a printing element board, on one face of which an ink flow path formation member having ink orifices is arranged and on the other face of which a first terminal potion is formed, comprising: a pressure portion configured to press, toward the support member, an peripheral area that extends outward from the ink flow path formation member on the one face, so that the first terminal portion located on the other face, at a location opposite the peripheral area, is brought into contact with the second terminal portion, wherein the pressure portion includes a clearance portion provided to prevent interference with the ink flow path formation member.

According to the present invention, the first terminal portion of the printing element board and the second terminal portion can be bonded together by pressing the peripheral area, which will not interfere with the ink flow path formation member. Therefore, damage to the ink flow path formation member can be reduced. Further, since the first terminal portion of the printing element board and the second terminal portion of the support member are positioned at locations opposite the peripheral area, the pressure force exerted on the peripheral area can be appropriately applied to the first and second terminals, and a satisfactory bonded state can be obtained.

Further features of the present invention will become apparent from the following description of exemplary embodiments (with reference to the attached drawings).

DESCRIPTION OF THE EMBODIMENTS

First Embodiment

An inkjet print head and a manufacturing method therefor according to a first embodiment of the present invention will now be described, while referring to FIGS. 1 to 3B.

Figure 1:
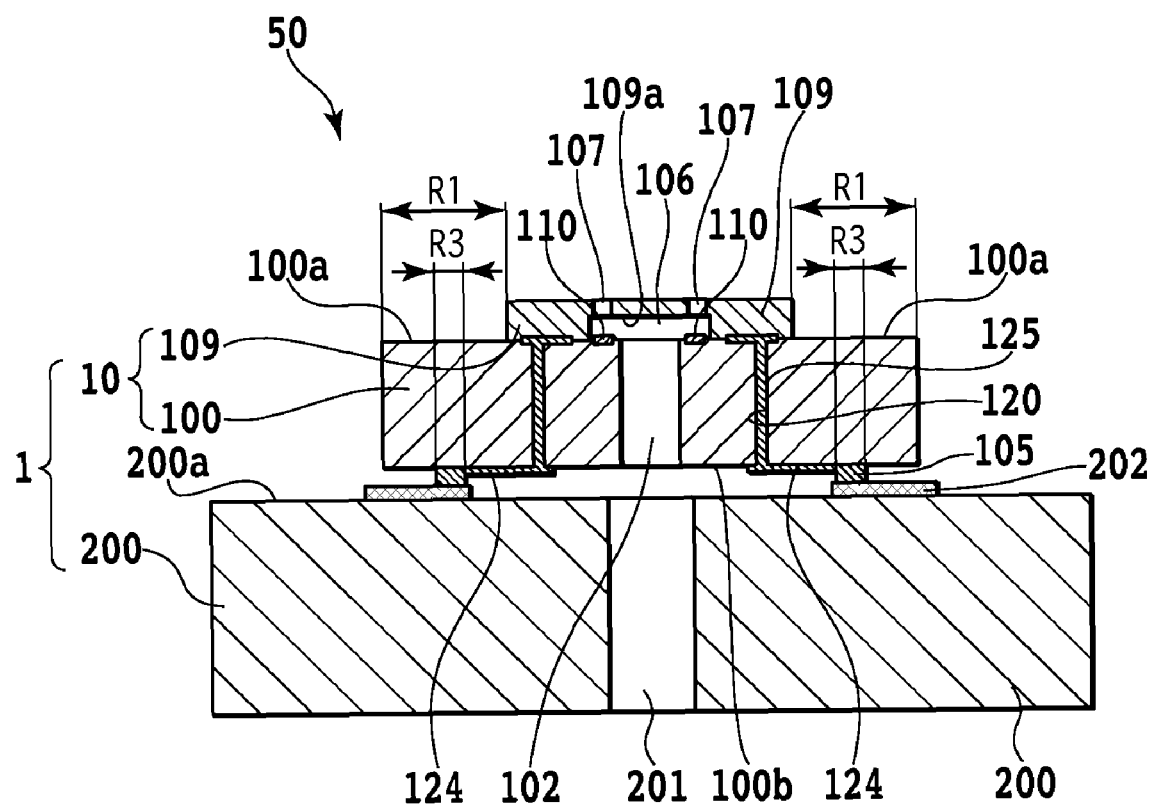
FIG. 1 is a cross-sectional side view of the structure of a print head according to a first embodiment of the present invention.
Figure 2A:
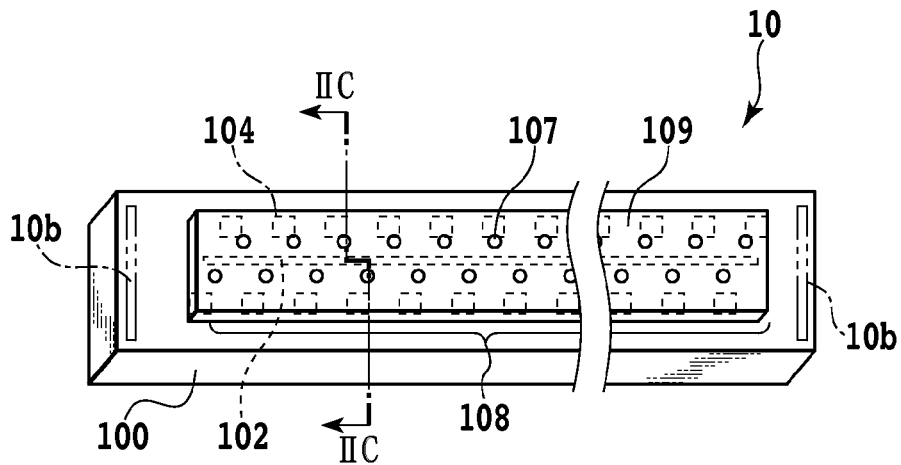
FIG. 2A is a perspective, obverse face view of a print head chip illustrated in FIG. 1.
Figure 2B:
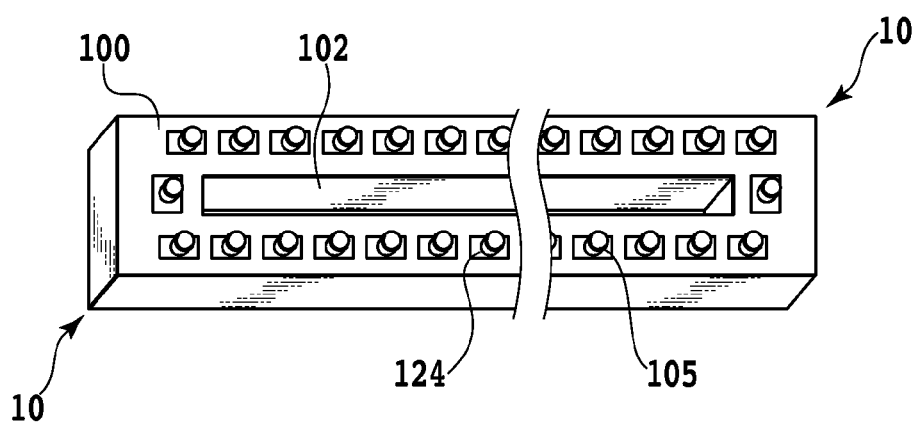
FIG. 2B is a perspective, reverse face view of the print head chip illustrated in FIG. 1.
Figure 2C:
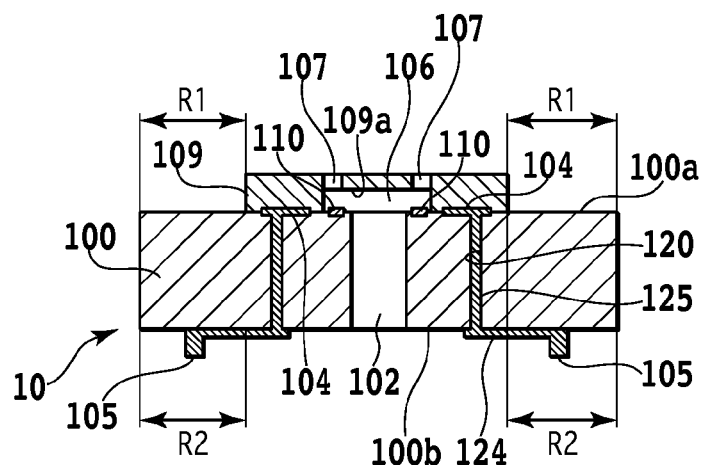
FIG. 2C is a cross-sectional view taken along line IIC-IIC in FIG. 2A.
Figure 3A:
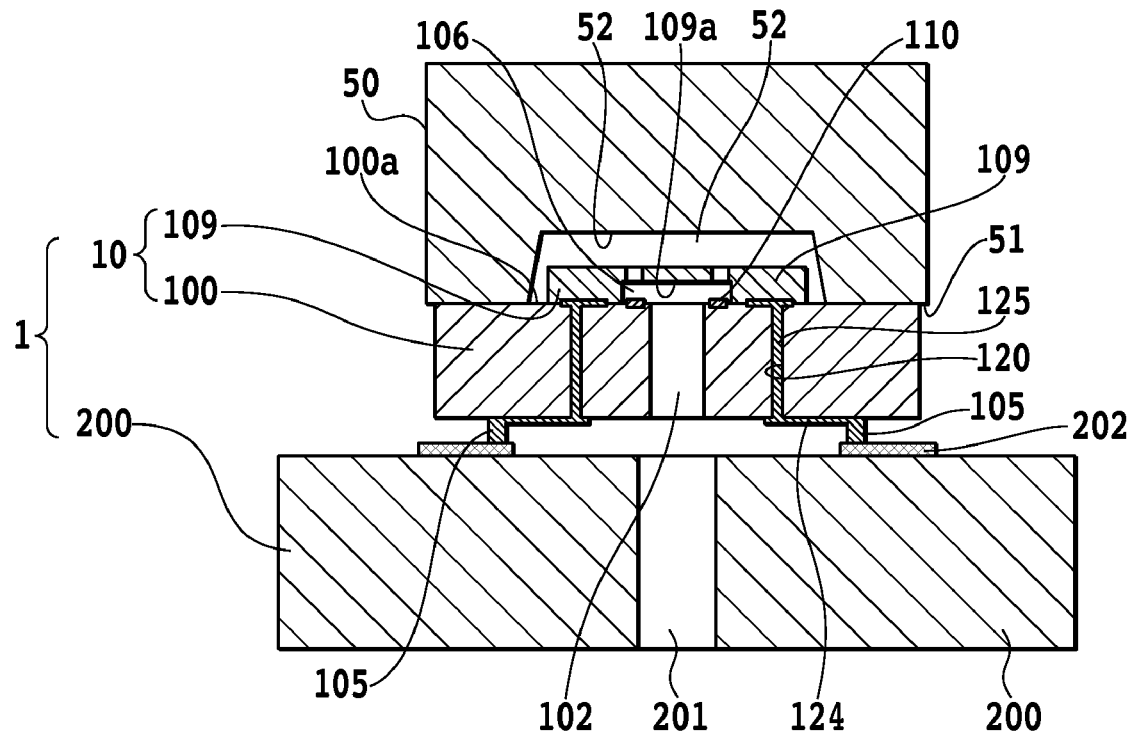
FIG. 3A is a cross-sectional side view of the state immediately before the print head chip in FIG. 2C is bonded to a support member.
Figure 3B:
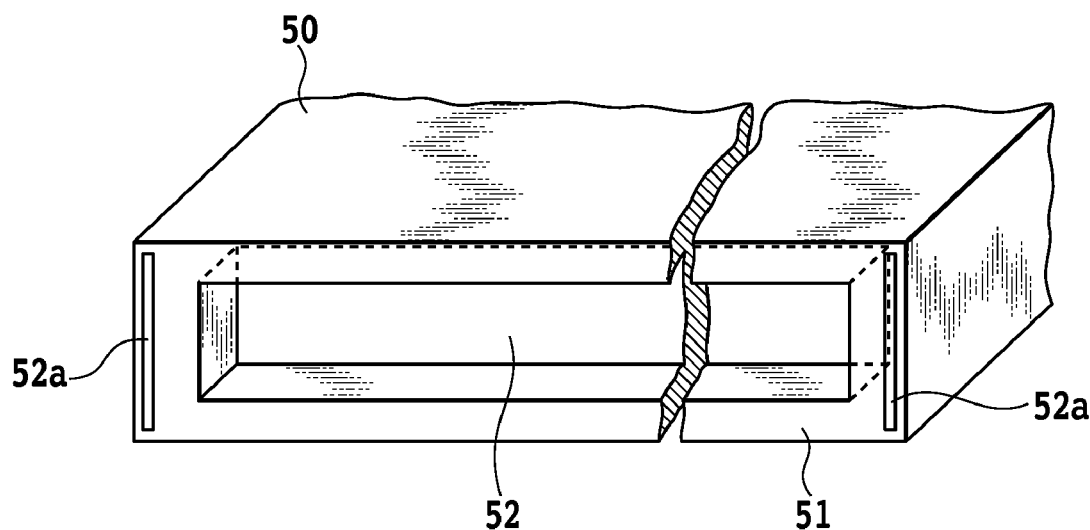
FIG. 3B is a perspective view of the end shape of an ultrasonic horn that serves as a mounting tool for mounting a print head chip on a support member.

FIG. 1 is a cross-sectional side view of the structure of the inkjet print head of this invention. FIGS. 2A to 2C are views illustrating the structure of a print head chip 10 shown in FIG. 1. FIG. 2A is a perspective, obverse face view of the print head chip 10, FIG. 2B is a perspective, reverse face view of the print head chip 10, and FIG. 2C is a cross-sectional view taken along line IIC-IIC in FIG. 2A. FIG. 3A is a cross-sectional side view of the state immediately before the print head chip 10 in FIG. 2C is bonded to a support member, and FIG. 3B is a view illustrating the end shape of an ultrasonic horn 50 that serves as a mounting tool for mounting the print head chip 10 on a support member 200. It should be noted that FIGS. 1 and 3A illustrate the cross section of an inkjet print head, taken along line IIC-IIC in FIG. 2A.

In FIG. 1, an inkjet print head 1 includes the print head chip 10 and the support member 200 where the print head chip 10 is to be mounted. The print head chip 10 includes: a printing element board 100 made of silicon (Si); and an ink flow path formation member 109 that is arranged on one face (the obverse face) 100a of the printing element board 100. Arrays of orifices 107 for ejecting ink are formed in the ink flow path formation member, as shown in FIG. 2A, and a recessed portion 109a that serves as a bubble generation chamber 106 is defined at a gap relative to the printing element board 100.

An ink supply port 102 that communicates with the bubble generation chamber 106 is formed in the printing element board 100. A circuit (not shown) and electrodes 104 to be electrically connected to the circuit are formed on the other face (the reverse face) 100b of the printing element board 100. Further, a plurality of electro-thermal converting elements 110, to be electrically connected to the electrodes 104, are arranged in the liquid path (bubble generation chamber) 106 that communicates with the orifices 107. Reverse-face electrodes (first terminal portions) 124 are formed on the reverse face 100b of the printing element board 100. The reverse-face electrodes are electrically connected to a wiring circuit (not shown), which is formed on the obverse face 100a of the printing element board 100, via lead-through wiring 125 that is inserted into a through hole 120 penetrating the head chip 10 from the obverse face to the reverse face.

The support member 200 is provided, for example, as a ceramic board. An ink supply port 20, formed in the center of the support member 200, communicates with the ink supply port 102 formed in the printing element board 100. When the inkjet print head is in use, the ink supply port 201 is connected to an ink supply source (not shown), such as an ink tank. A liquid supplied by the ink supply source to the ink supply port 201 is transmitted, via the ink supply port 102 formed in the printing element board 100, to the bubble generation chamber 106 and the orifices 107. Furthermore, electrode terminals (second terminal portions) 202 are formed on one face (the obverse face) 200a of the support member 200, so that they can be electrically connected to external electrode terminals (not shown) by three-dimensional wiring (not shown).

It should be noted that ink, as described in the specification and claims of the invention is defined as a liquid that is to be applied to a printing medium to form images, designs, patterns to the printing medium, or that can be employed to process a printing medium or to perform ink treatment processes. Ink treatment processes include, for example, a process for solidifying or for insolubilization of the colorant in ink that is applied to printing media or to other surfaces.

The structure of the print head chip 10 will be described while referring to FIGS. 2A to 2C.

As previously described, the print head chip 10 shown in FIGS. 2A to 2C is in the state before the chip 10 is mounted on the support member 200.

As shown in FIG. 2A, two orifice arrays 108, consisting of the orifices 107 for ejecting ink, are formed in the ink flow path formation member 109, and the ink supply port 102 is located between the two orifice arrays 108. The opening for the ink supply port 102 has substantially the same length as an orifice array 108. When the electro-thermal converting elements 110 located opposite the orifices 107 are turned on, heat is generated and ink supplied through the ink supply port 102 to the bubble generation chamber 106 and the orifices 107, in the above described manner, begins to bubble. Then, ink is ejected from the orifices 107 by pressure produced by bubble generation. It should be noted that the print head chip 10 in this embodiment employs a so-called side shooter type, whereby ink is ejected in a direction perpendicular to the obverse face 100a of the printing element board 100, where the electro-thermal converting elements 110 are arranged.

Further, as shown in FIG. 2B, gold bumps 105, 20 μm high, that serve as buffer members are formed on the reverse-face electrodes 124 of the printing element board 100 of the print head chip 10. The print head 10 is a single color pint head that ejects ink of only one color, and about 350 bumps are formed in this embodiment.

On the face of the printing element board 100 where electro-thermal converting elements 110 are arranged, i.e., the face (the obverse face) 100a on which the ink flow path formation member 109 is mounted, an area R1 is peripheral outward from the ink flow path formation member 109, as shown in FIGS. 2C and 2A. Hereinafter, this area R1 is called a peripheral area R1. On the face (the reverse face) 100b of the printing element board 100, on which the ink flow path formation member 109 is not mounted, the reverse-face electrodes 124 are located in an area R2, opposite the peripheral area R1, and the gold bumps 105 are formed on the reverse-face electrodes 124. During the bonding process, which will be described later, the gold bumps 105 are ultrasonically bonded while pressed against the support member 200 via the printing element board 100. As a result, the gold bumps 105 bonded to the electrode terminals 202 are flattened, compared with their state prior to bonding, in the direction pressure is applied. Thus, strictly, the areas where the gold bumps 105 are formed and bonded areas R3 obtained by the bonding process are different. It should be noted, however, that when the gold bumps 105 are positioned inside the area R2 opposite the peripheral area R1, the bonded areas R3 are also inside the area R2 opposite the peripheral area R1.

Figure 4:
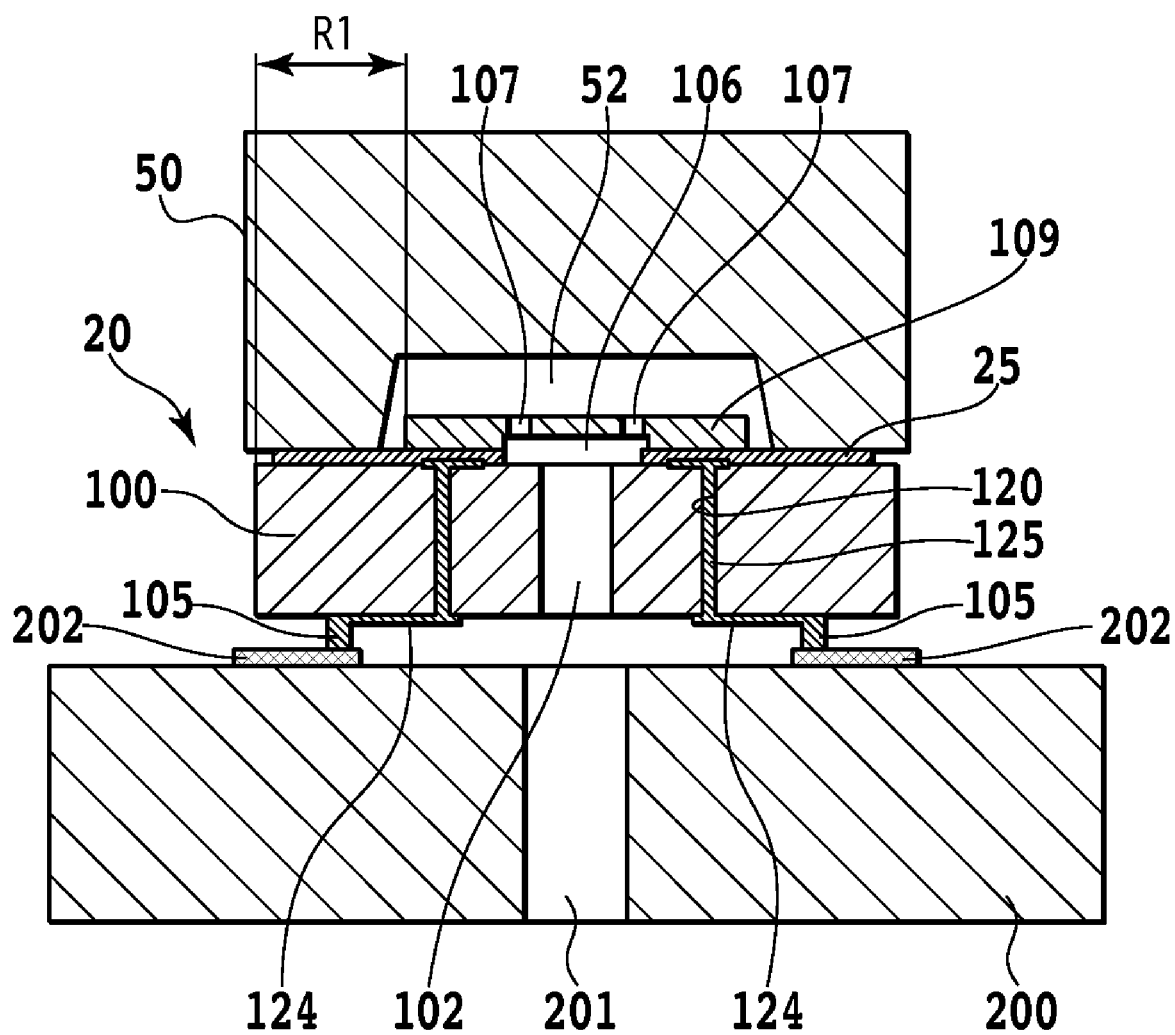
FIG. 4 is a cross-sectional side view of the state immediately before a print head chip according to a second embodiment is bonded to a support member.

A mounting tool for mounting the print head chip 10 on the support member 200 and the mounting processing will now be described, while referring to FIGS. 3A and 3B and FIG. 4.

For the mounting processing, an ultrasonic horn 50, having an end shaped as shown in FIG. 3B and the cross sectional shape shown in FIG. 3A, is employed as a mounting tool that mounts, on the support member 200, the print head chip 10 having the structure shown in FIGS. 2A to 2C. As shown in FIG. 3B, an end face 51 is formed annularly along the peripheral end of the ultrasonic horn 50 and contacts the peripheral area R1 of the ink flow path formation member 109, and a recessed clearance portion 52 is formed in the end face 51 to avoid contact with the ink flow path formation member 109.

Further, suction holes 52a are formed near the two edges of the end face 51 of the ultrasonic horn 50 in order to draw inward, by suction, suctioned portions 10b (see FIG. 2A) that are formed in the edges of the peripheral area R1 of the printing element board 100. The suction holes 52a are connected to a negative pressure generation device (not shown), and the suctioned portions 10b of the print head chip 10 can be attached to the end face 51 by a negative pressure exerted through the suction holes 52a. Furthermore, since the clearance portions 52 are formed in the end face 51, the print head chip 10 can be attached to the end face 51, by suction, without contacting the flow path formation member 109.

When the ultrasonic horn 50 is employed for mounting the print head chip 10 on the support member 200, first, the ultrasonic horn 50 is moved to the obverse face of the print head chip 10 to align the clearance portions 52, formed in the edges of the ultrasonic horn 50, with the ink flow path formation member 109. Sequentially, then, the peripheral area R1 of the print head chip 10 is held to the end face 51 of the ultrasonic horn 50 by the force of negative pressure suction exerted through the suction holes 52a. Then, the ultrasonic horn 50, which is holding the print head chip 10, is moved above the obverse face 200a of the support member 200, and the reverse-face electrodes 124 of the print head chip 10 are aligned with the electrode terminals (second terminal portions) 202 of the support member 200. Following this, the ultrasonic horn 50 descends, and presses the gold bumps 105 against the electrode terminals 202 of the support member 200 under a predetermined pressure. Thereafter, ultrasonic vibrations, having an amplitude of 0.2 to 5.0 μm, are horizontally applied to the ultrasonic horn 50. As a result, about 350 gold bumps 105 and the electrode terminals 202 are bonded together, and the print head unit 1 is completed.

During the ultrasonic bonding processing, since contact with the flow path formation member 109 can be avoided because of the clearance portions 52, the ultrasonic horn 50 does not damage the flow path formation member 50. A clearance of about 30 μm is appropriate between the clearance portions 52 of the ultrasonic horn 50 and the flow path formation member 109, considering that an alignment accuracy of ±20 μm, at the time whereat the ultrasonic horn suctions the print head chip 10 in by suction, and that the maximum amplitude for ultrasonic vibration is 5 μm. Further, since the gold bumps 105 are located in the area R2 of the printing element board 100, opposite the peripheral area R1, the annular end face 51 need only press against the peripheral area R1. Then, a load can be accurately applied to all of the gold bumps 105, and an appropriate bonded state can be obtained.

As described above, according to this embodiment, the gold bumps 105 can be appropriately bonded to the electrode terminals 202, and during the ultrasonic bonding process, damage to the ink flow path formation member 109 can be reduced. Therefore, a reliable and inexpensive inkjet print head can be provided.

In this embodiment, bonding has been performed by applying ultrasonic vibrations. As another method, the ultrasonic horn may be heated by an internal heater, so that the gold bumps 105 can be thermally bonded to the electrode terminals 202. However, for this embodiment, since the face of the ultrasonic horn 50 that contacts the printing element board 100 is small, heat might escape to the printing element board 100 that has a higher thermal conductivity. Therefore, when a heater internally mounted in the ultrasonic horn 50 is employed, impulse heating whereby the gold bumps 105 can be heated within a short period of time is effective. In this case, if the clearance portions 52 are not present between the ultrasonic horn 50 and the flow path formation member 109, heat would be transferred from the ultrasonic horn 50 to the printing element board 100 via the flow path formation member 109, made of a resin, and as a result, the ink flow path formation member 109 would be destroyed. Therefore, even in a case wherein the ultrasonic horn 50 is heated to thermally press-bond the printing element board 100 to the support member 200, it is effective for the clearance portions 52 of the flow path formation member 109 to be formed in the ultrasonic horn 50.

Second Embodiment

A second embodiment of the present invention will now be described while referring to FIG. 4.

In this embodiment, an ultrasonic horn 50 is to directly contact a peripheral area R1 of a printing element board 100, and thus, the wiring (not shown) on the printing element board 100 might be scratched by the ultrasonic horn 50. Therefore, in this embodiment, as shown in FIG. 4, an organic thin film 25, which serves as an adhesion layer for improving the adhesiveness between an ink flow path formation member 109 and the printing element board 100, is laminated to extend to the peripheral area R1, which is a portion of the printing element board 100 contacted by the ultrasonic horn 50. With this arrangement, the ultrasonic horn 50 does not directly contact wiring that is formed on the printing element board 100, and damage to the printing element board 100 due to contact with the ultrasonic horn 50 can be prevented.

The process for forming an organic thin film 25 used for improving adhesiveness is performed in the following manner. First, as an adhesive layer, the organic thin film 25, composed of polyether amide, 2.0 μm thick, is formed on the printing element board 100, where electro-thermal converting elements (not shown) are arranged as ink pressure generation elements. Then, patterning is performed on the organic thin film 25 using a positive resist mask (not shown), and $O_2$ plasma ashing is performed using a positive resist pattern as a mask, to pattern the organic thin film 25. Finally, the positive resist pattern employed as a mask is removed, and an adhesive layer is obtained. Thereafter, using another positive resist (not shown), an ink flow path pattern is formed on the printing element board 100 (thickness 12 μm).

Sequentially, an epoxy resin layer that serves as the ink flow path formation member 109 is deposited on the printing element board 100, and is patterned to obtain orifices 107. Following this, dry etching is performed for the printing element board 100 to form an ink supply port 102. Thereafter, the positive resist, where the ink flow path pattern is removed, and the epoxy resin that forms the ink flow path formation member 109 is completely cured, so that a print head chip 20 is obtained.

In the print head chip 20, the ink flow path formation member 109 is adhered to the surface of the printing element board 100 (Ta wiring face/SiN insulating film face) via the organic thin film 25, which is an adhesive layer. It should be noted that, as illustrated in FIG. 4, the organic thin film 25 covers substantially the entire surface, excluding the ink supply port 102, the flow path formation member 109 and the peripheral cut portion. Therefore, in the process performed to draw in the printing element board 100 using the ultrasonic horn 50, or the process for bonding reverse-face electrodes 124 of the print head chip 20 to electrode terminals 202 of a support member 200, the probability that the wiring of the printing element board 100 will be scratched by the ultrasonic horn 50 can be considerably reduced.

Furthermore, according to the second embodiment, a protective layer, for the wiring (not shown) on the printing element board 100, is also deposited during the process for forming the organic thin film 25 which serves as an adhesive layer between the printing element board 100 and the support member 200. Therefore, an additional process and an additional member are not required, and a reliable and inexpensive inkjet print head can be provided.

An SiN insulating film used for insulating the wiring on the printing element board 100 can also be employed as a protective layer for the printing element board 100. It should be noted, however, that the thickness of the SiN insulating film is equal to or smaller than 0.1 μm, and during the bonding process, the printing element board 100 might be slightly scratched by the ultrasonic horn 50. Another protective film can also be deposited in the peripheral area R1 to reduce damage to the wiring. In this case, however, an additional process for forming the protective layer is required, and the manufacturing cost may be increased, compared with that of this embodiment.

Third Embodiment

A third embodiment of the present invention will now be described.

In the above described first embodiment, one ink flow path formation member 109 has been arranged for the printing element board 100. In a third embodiment of the invention, a plurality of ink flow path formation members are arranged on a printing element board to cope with a plurality of colors of ink. This embodiment will now be described in detail, while referring to FIGS. 5A to 8.

Figure 5A:
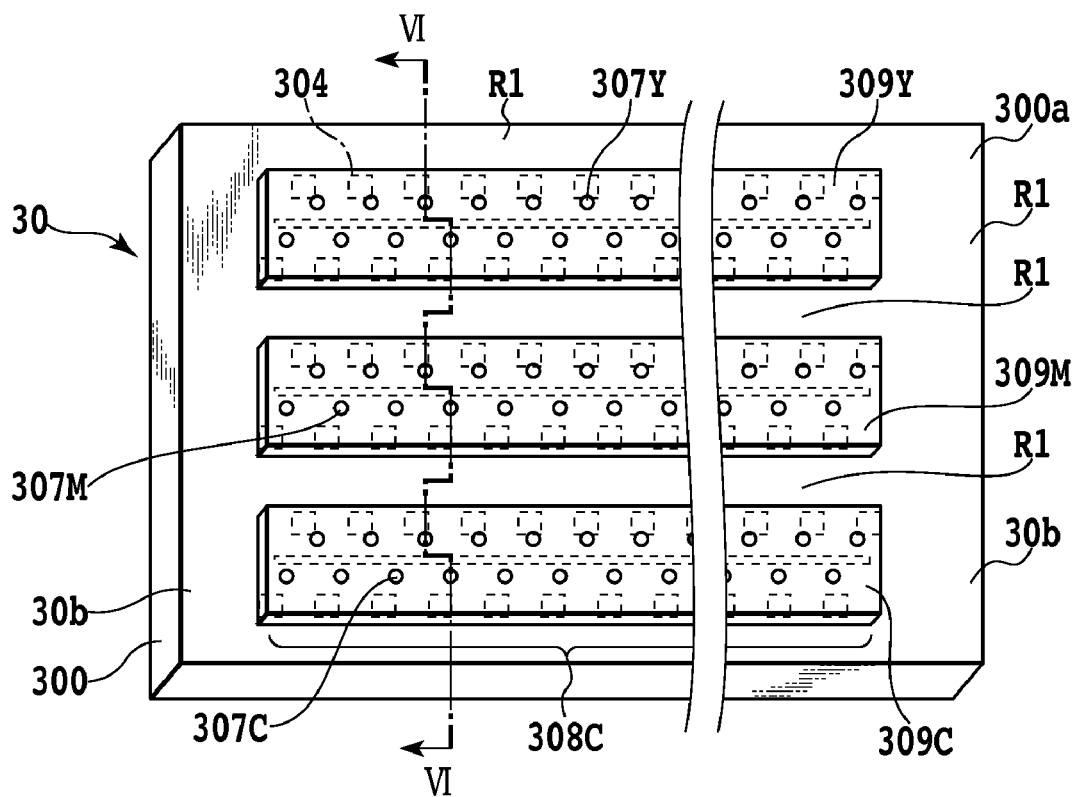
FIG. 5A is a perspective, orifice surface (obverse face) view of a color print head chip employed for a third embodiment.
Figure 5B:
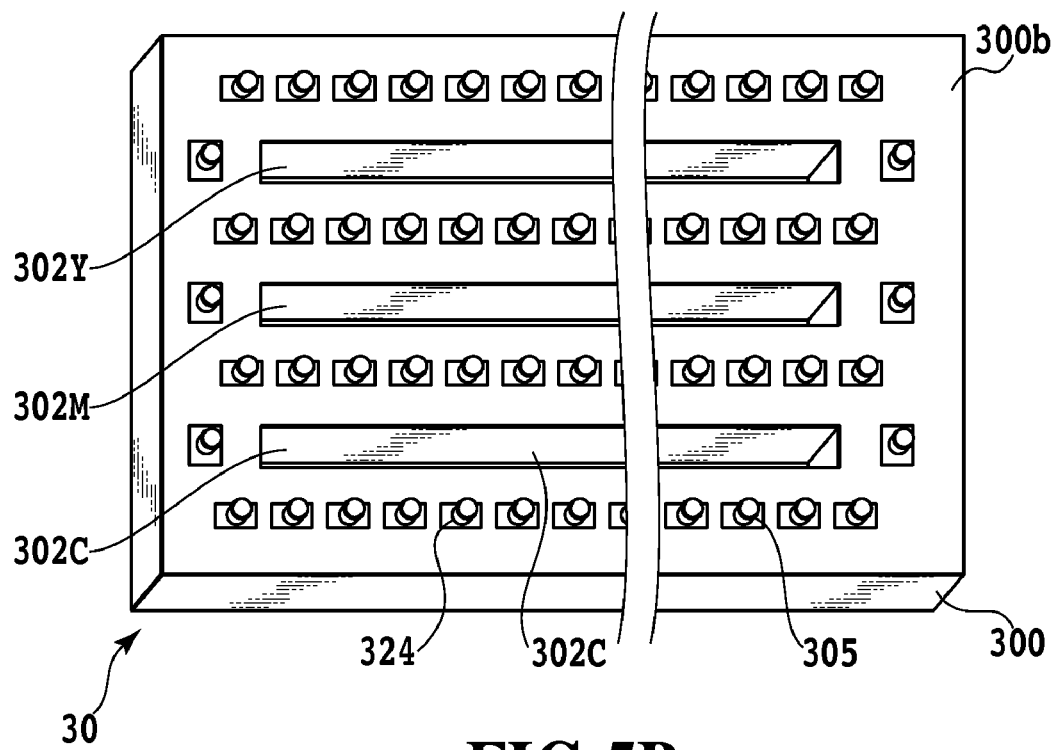
FIG. 5B is a perspective, reverse face view of the print head chip in FIG. 5A.
Figure 6:
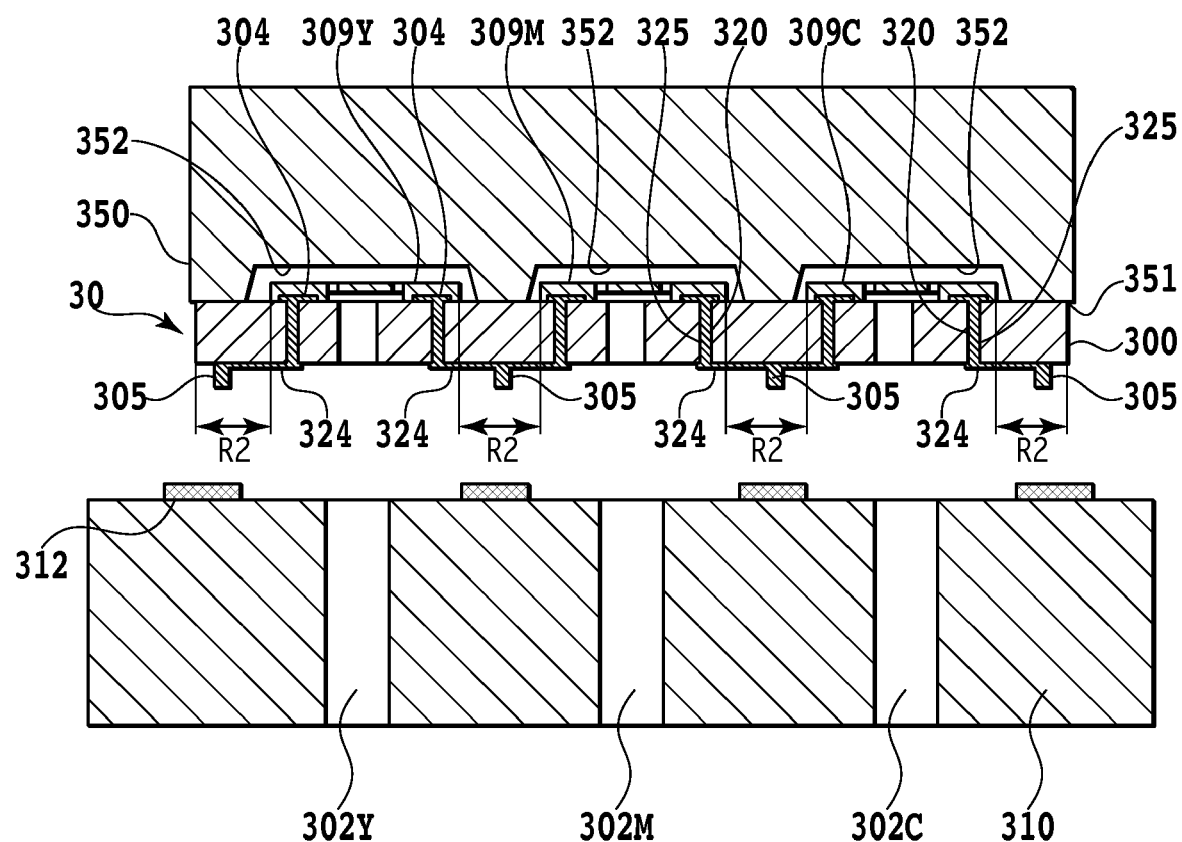
FIG. 6 is a cross-sectional side view of the state before the print head chip shown in FIGS. 5A and 5B is mounted to a support member.
Figure 7:
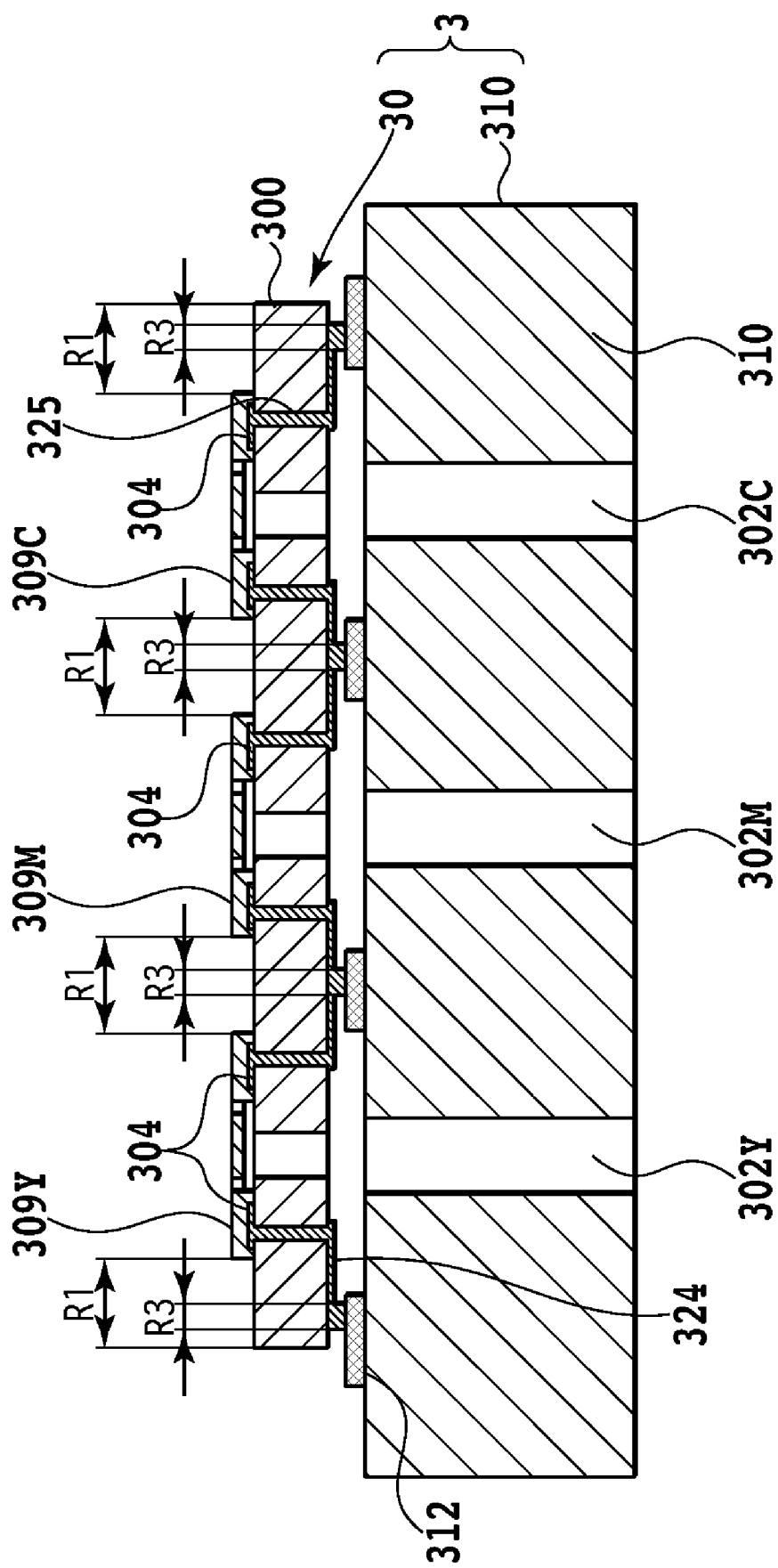
FIG. 7 is a cross-sectional side view of the state wherein the print head chip shown in FIGS. 5A and 5B is mounted to the support member.
Figure 8:
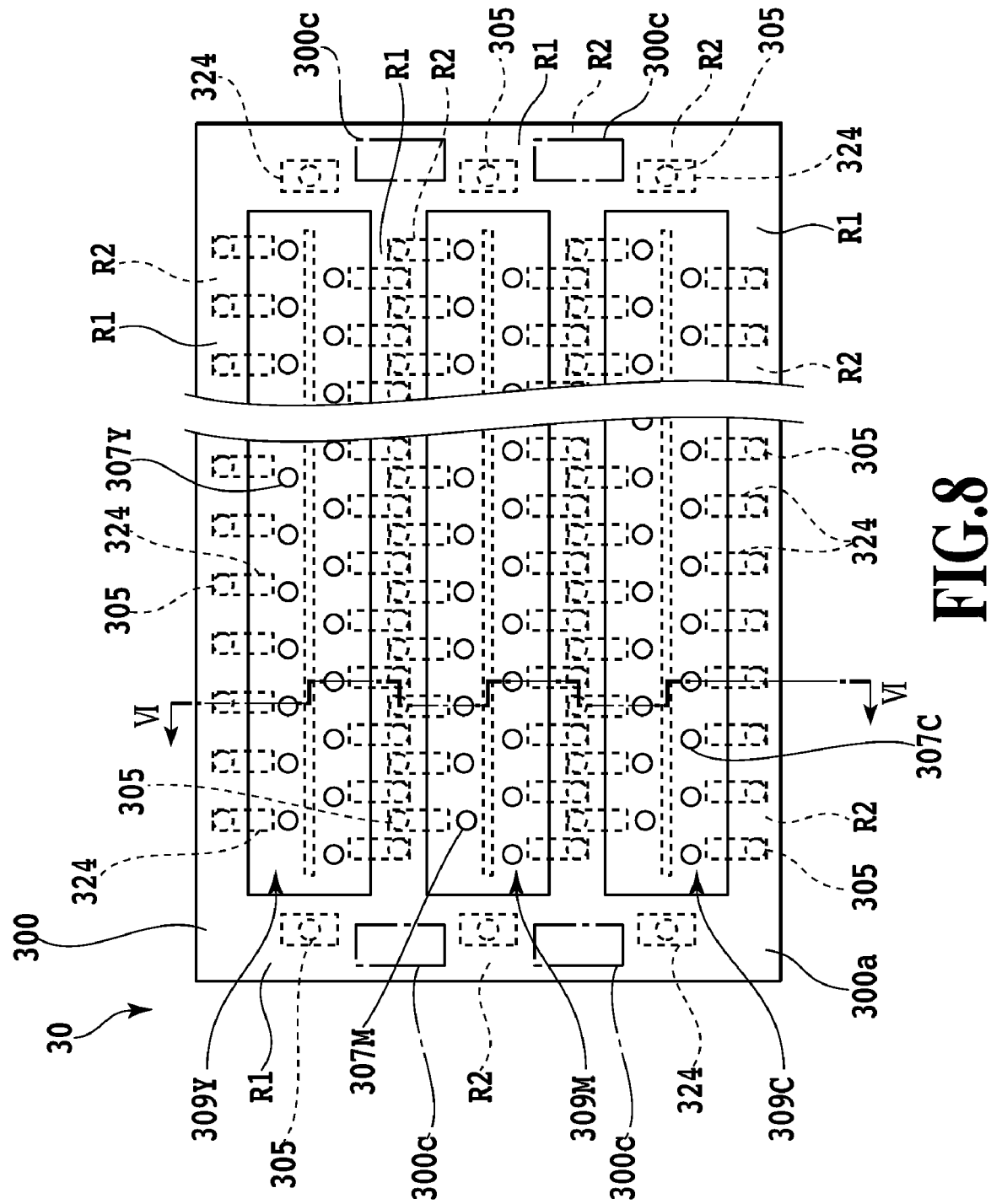
FIG. 8 is an obverse face plan view of the print head chip shown in FIGS. 5A and 5B.

FIG. 5A is a perspective view of a color print head chip 30 employed for the third embodiment, taken from an orifice surface (obverse face), and FIG. 5B is a perspective view of the print head chip 30 in FIG. 5A, obtained from the reverse face. FIGS. 6 and 7 are cross-sectional side views of an inkjet print head for the third embodiment, taken along line B-B' in FIG. 5A. FIG. 6 shows the state before the print head chip 30 is mounted on a support member 310, and FIG. 7 shows the state after the print head chip 30 has been mounted. FIG. 8 is a plan view of the print head chip 30 in FIG. 5A, obtained from the obverse face.

As shown in FIG. 7, an inkjet print head 3 of the third embodiment is constituted by the print head chip 30 and the support member 310, and this is substantially the same as in the first and second embodiments. For the printing element board 300 of the third embodiment, however, as shown in FIGS. 5A to 7, three ink flow path formation members 309Y, 309M and 309C are formed in parallel at predetermined intervals. Specifically, the ink flow path formation member 309Y is a member where orifices 307Y for yellow ink are arranged, the ink flow path formation member 309M is a member where orifices 307M for magenta ink are arranged, and the ink flow path formation member 309C is a member where orifices 307C for cyan ink are arranged.

The structure of an ink flow path formation member will be described by employing, as an example, the ink flow path formation member 309C that ejects cyan ink. In the ink flow path formation member 309C, the orifices 307C are arranged in a zigzag manner to provide two orifice arrays 308C. Further, an ink supply port 302C, for supplying supply ink, is formed in the reverse face of the ink flow path formation member 309C, and has a length almost equal to the length of the orifice array 308C. This structure for the ink flow path formation member is also employed for the ink flow path formation members 309Y for yellow ink and the ink flow path formation member 309M for magenta ink.

Electro-thermal converting elements (not shown) are located on an obverse face 300a of the printing element board 300, at positions corresponding to the orifices 307Y, 307M, and 307C of the ink flow path formation member 309Y, 309M, and 307C. As shown in FIG. 5A, the individual ink flow path formation members 309Y, 309M and 309C are arranged on the obverse face 300a, and a peripheral area R1 is peripheral outward from the peripheries of these flow path formation members. In this embodiment, since the ink flow path formation members 309Y, 309M and 309C are located at predetermined intervals, the peripheral area R1 is also formed among the individual ink flow path formation members 309Y, 309M and 309C.

On a reverse face 300b of the printing element board 300, a plurality of reverse-face electrodes (first terminal portions) 324 are formed along the peripheries of the individual ink supply ports 302Y, 302Y, and 302C, and gold bumps 305 20 μm high are provided as buffer members for the reverse-face electrodes 324. The gold bumps 305 are located in area R2 (see FIGS. 6 and 8) opposite the peripheral area R1 (see FIG. 7) on the obverse face 300a of the printing element board 300. The external size of the printing element board 300 is width W 3 mm and length L 30 mm. For a color inkjet print head for which the individual orifice arrays 308Y, 308M, or 308C are one inch long, about 700 gold bumps 305 are employed. Furthermore, through holes 320 (see FIG. 6) are formed in the printing element board 300 by laser or etching, and lead-through wiring 325 is inserted through them in order to electrically connect the reverse-face electrodes 324 to a plurality of electrodes 304 that are formed on the obverse face 300 a of the printing element board 300.

A print head chip 30 having this arrangement is mounted on the support member 310 using an ultrasonic horn 350, shown in FIG. 6. First, the ultrasonic horn 350 holds the print head chip 30 by suction, and aligns the print head chip 30 with the support member 310, so that the gold bumps 305 on the print head chip 30 contact the electrode terminals (second terminal portions) 312 of the support member 310. Then, the ultrasonic horn 350 presses the printing element board 300 toward the support member 310, and ultrasonically vibrates in a direction perpendicular to the pressure direction to electrically bond the electrode terminals 312 to the bumps 305.

An end face 351 of the ultrasonic horn 350 is a holding face on which the print head chip 30 is to be suctioned. Suction holes (not shown) are formed in the end face 351 and are connected to a negative pressure generation source (not shown) to draw in portions 300c (see FIG. 8) near the ends of the individual orifice arrays 308Y, 308M, and 308C of the printing element board 300. It should be noted that three recessed clearance portions 352 are formed in the end face 351 corresponding to the three ink flow path formation members 309Y, 309M, and 309C that are arranged on the print head chip 30.

Since the clearance portions 352 are formed in the end face 351 of the ultrasonic horn 350, the ultrasonic horn 350 can suction the print head 30, without contacting the ink flow path formation members 309Y, 309M, and 309C. At this time, the end face 351 of the ultrasonic horn 350 contacts the peripheral area R1 of the printing element board 300. It should be noted that a clearance of about 30 μm is appropriate between the clearance portions 351 and the ink flowpath formation members 309Y, 309M, and 309C, while taking into account an alignment accuracy of ±20 μm, required when the ultrasonic horn 350 uses suction to suction the print head chip 30, and ultrasonic vibration having a maximum amplitude of 5 μm.

During the process for bonding the gold bumps 305 to the electrode terminals 312, the ultrasonic horn 350 should accurately impose a load on the gold bumps 350 via the print head chip 30, i.e., the load should be imposed immediately above the gold bumps 350. According to the third embodiment, since the ultrasonic horn 350 presses down, from immediately above, on all the gold bumps 350 located in the area R2 of the reverse face 300b opposite the peripheral area R1, the possibility that an offset load will be imposed on the printing element board 300 is eliminated. Therefore, about 700 gold bumps 305 and the electrode terminals 312 can be bonded evenly and at the same time. Through this bonding process, as shown in FIG. 7, areas R3, where the gold bumps 305 are bonded to the electrode terminals 312, are located in the area opposite the peripheral area R1.

As described above, according to the third embodiment, since the clearance portions 352 are formed in the ultrasonic horn 350, all of about 700 gold bumps 305 can be bonded to the electrode terminals 312 by uniformly imposing a load, without damaging the flow path formation members 309Y, 309M, and 309C. As a result, the reliable inkjet print head 3 can be provided.

Fourth Embodiment

Figure 9:
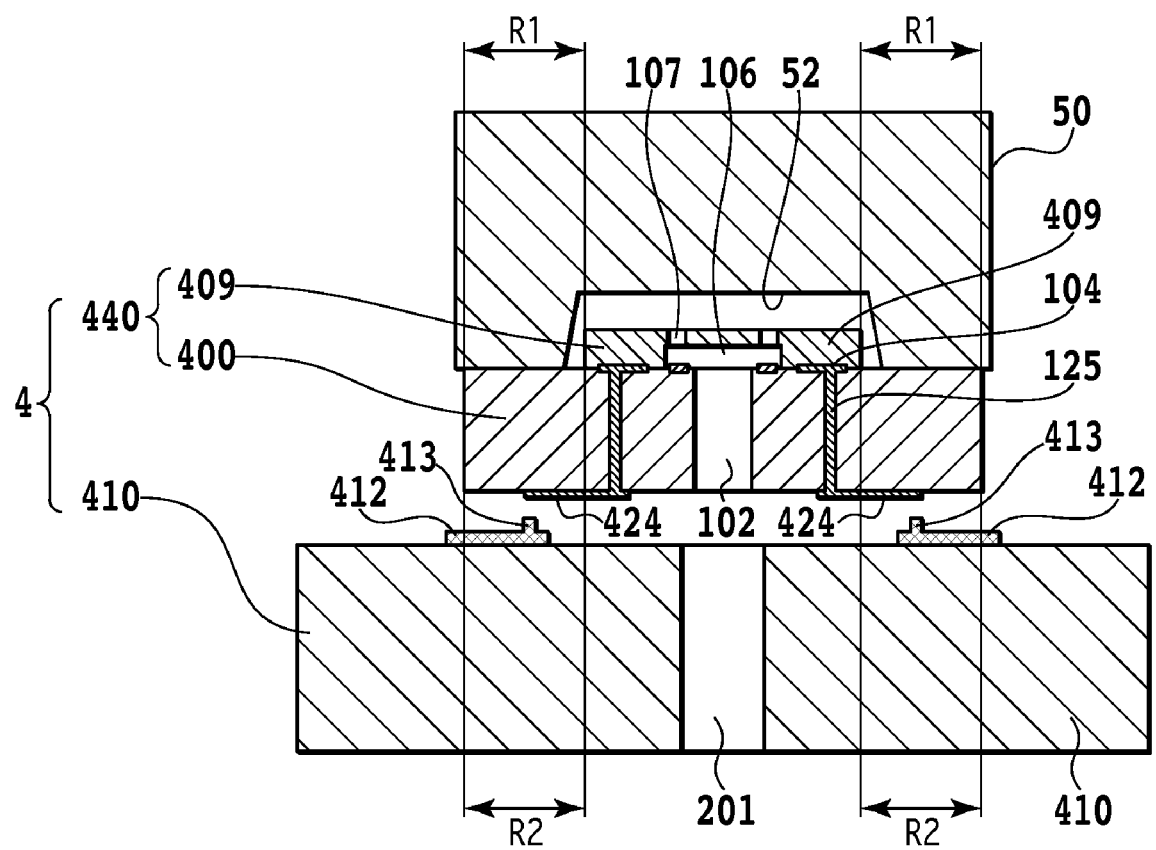
FIG. 9 is a cross-sectional side view of the state before a print head chip according to a fourth embodiment is mounted on a support member.
Figure 10:
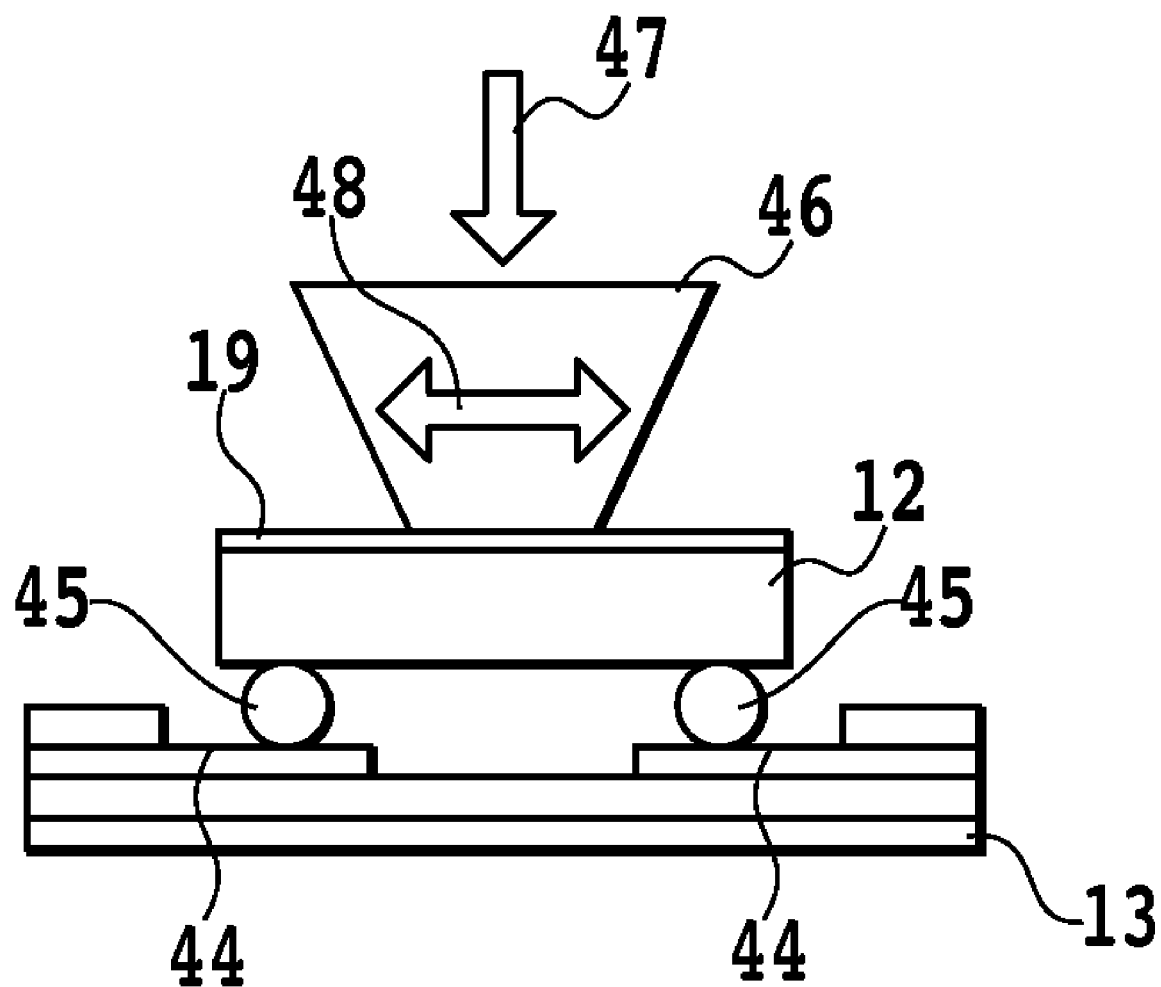
FIG. 10 is a cross-sectional side view of the state before a conventional print head chip is mounted on a support member.

A fourth embodiment of the present invention will now be described while referring to FIG. 9.

In the first embodiment, gold bumps 20 μm high were formed as buffer members on the reverse-face electrodes 124 that are arranged on the reverse face of the printing element board 100. According to the fourth embodiment, gold bumps 413 are formed on electrode terminal portions 412 of a support member 410.

In a case wherein a plurality of gold bumps are to be formed on the reverse-face electrodes of the printing element board, as in the first embodiment, using plated bumps is a convenient means for saving on the manufacturing costs. However, since a plating process requires a long period of time, in a case where only a small number of gold bumps are used, using stud bumps is more convenient, when the ball bonding technique for gold bumps is employed. For a printing element board used for the present invention, since an ink flow path formation member is not formed in an area opposite a gold bump formation area, the strength may be lower than a printing element board whereon an ink flow path formation member is formed across the entire surface. But were stud bumps are formed on the printing element board of this invention, the printing element board would be destroyed. Especially, when the printing element board is thin, only 200 μm thick, for example, stud bumps can not be formed.

Therefore, in the fourth embodiment, no bumps are formed on reverse-face electrodes (first terminal portions) 424 of a printing element board 400, and instead, gold stud bumps 413 20 μm high, which serve as buffer members are formed on electrode terminals of a support member 410 and are bonded to the reverse-face electrodes 424 of the printing element board 400. The remainder of the arrangement is almost the same as that of the first arrangement. Also in the fourth embodiment, on the obverse face of the printing element board 400, a peripheral area R1 is peripheral outward from the side of an ink flow path formation member. Further, the reverse-face electrodes (first terminal portion) 424 are peripheral into an area R2 opposite the peripheral area R1, while the gold stud bumps 413 are present on the electrode terminals 412 of the support member 410 at positions opposite the reverse-face electrodes 424 that are peripheral into the area R2. The reverse-face electrodes 424 and the gold stud bumps 413 are bonded together using an ultrasonic horn 50. And as the gold stud bumps 413, stud bumps can be employed using the ball bonding technique. Thus, since the support member 410 has a much greater strength than the printing element board 400, stud bumps can be formed. Therefore, when only a small number of stud bumps is required, stud bumps on the support member 410 can be effectively used.

During In the bonding process, the ultrasonic horn 50 holds, by using suction to draw out air through suction holes (not shown), an area excluding a portion that is prevented from contacting an ink flow path formation member 409 by a clearance portion 52, i.e., the peripheral area R1 of the printing element area 400. Thereafter, the reverse-face electrodes 424 are aligned with the gold stud bumps 413, and horizontal ultrasonic vibrations of 0.2 to 5.0 μm are applied by the ultrasonic horn 50 while pressing the printing element board 400 toward the support member 410. As a result, about 350 gold bumps 413 and the reverse-face electrodes 424 are bonded together, and an inkjet print head 4 is completed.

In this embodiment, a clearance portion 52 for the ink flow path formation member 409 is also formed on the end face of the ultrasonic horn 50 that uses suction to hold a print head chip 440. Therefore, the ultrasonic horn 50 can use suction to draw in the print head chip 440, without contacting the ink flow path formation member 409. It should be noted that, as in the first embodiment, the suction holes (not shown) in the ultrasonic horn 50 are formed at locations that permit the two ends of the printing element board 400 to be sucked.

As described above, according to the individual embodiments, an area peripheral from the side of an ink flow path formation member is formed on the obverse face of the printing element board where the ink flow path formation is formed, and a clearance portion is formed on the end face of an ultrasonic horn in order to prevent interference with the ink flow path formation member. Therefore, the ultrasonic horn can be attached, using suction, to the peripheral area of the printing element area, while avoiding the contact with the ink flow path formation member. In addition, during the process for bonding the printing element board to the support member, the ultrasonic horn can be prevented from contacting the ink flow path formation member, so that damage to the ink flow path formation member is prevented. Furthermore, ultrasonic bonding can be performed for bumps that are located at positions opposite the peripheral area, while a load is imposed on the bumps by the ultrasonic horn. Therefore, the bumps can be accurately bonded to the opposite members (the reverse-face electrodes on the printing element board, or the electrode terminals on the support member), and superior operating reliability can be obtained.

Other Embodiment

In the individual embodiments described above, since bumps have been employed to bond the reverse-face electrodes on the printing element board to the electrode terminals on the support member, a difference in the positioning of the reverse-face electrodes, which are first terminals, and the electrode terminals, which are second terminals, has been eliminated. However, the present invention is not limited to this method, and without using bumps, the reverse-face electrodes and the electrode terminals can be locally bonded together. In this case, an area peripheral from the ink flow path formation member is prepared for the printing element board, and a clearance portion is formed in the end face of the ultrasonic horn. When the ultrasonic horn presses against the peripheral area of the printing element board, the clearance portion is employed to prevent contact with the ink flow path formation member. In this manner, local bonding of the electrode portion of the printing element board and the electrode portion of the support member can be appropriately performed.

Furthermore, in the above embodiments, suction holes used to suck the peripheral area of the printing element board have been formed in the end face of the ultrasonic horn that is used as an inkjet print head mounting tool. However, an ultrasonic horn having no suction holes may be employed. That is, an arbitrary ultrasonic horn can be employed so long as, while avoiding interference with the ink flow path formation member formed in the printing element board, the ultrasonic horn can apply pressure to the peripheral area of the printing element board that is positioned above the support member, and can transmit ultrasonic vibrations to the printing element board.

In addition, the inkjet print head may include: a pressure portion for applying pressure only to the peripheral portion of the printing element board, as described above, and using heat supplied by the pressure portion, the first terminal portion of the printing element board and the second terminal portion can be thermally bonded together. Therefore, the inkjet print head mounting tool of this invention need only be a pressure member that includes a pressure portion for pressing only the peripheral portion.

Moreover, a method for providing a peripheral area for a printing element board can be a method for employing a printing element board having a plane larger than the plane of an ink flow path formation member, or a method for employing an ink flow path formation member having a plane smaller than the plane of a printing element board. The method to be employed should be determined in accordance with various conditions, such as the shape, the size, the manufacturing cost and the strength of an inkjet print head to be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-155360, filed Jun. 12, 2007, which is hereby incorporated by reference herein in its entirety.

What is claimed is:

1. A manufacturing method for an inkjet print head comprising:
    preparing a printing element board comprising;
        a first surface including:
            a first area having a printing element configured to generate energy for ejecting ink from an ejection port, and an ejection port forming member formed so that the ejection port is located above the printing element; and
            a second area around the first area;
        a second surface opposed to the first surface; and
        an electrode penetrating through the first and second surfaces of the printing element board;
    providing a first terminal on a third area that is a position by projecting the second area of the first surface onto the second surface, when viewed from a direction perpendicular to the first surface, the first terminal being connected to the printing element via the electrode;
    preparing a support member having a second terminal; and
    bonding the first terminal and the second terminal while pressing the second area of the printing element board.

2. A manufacturing method according to claim 1, wherein the step of bonding the first terminal and the second terminal comprises:
    holding the printing element board by suction of the second area by a pressure member of a pressure device; and
    bonding the first terminal and the second terminal while pressing the second area by using the pressing member.

3. A manufacturing method according to claim 1, further comprising applying ultrasonic vibrations to the first and second terminals in the condition that the first and second terminals are pressed against each other.

4. A manufacturing method according to claim 1, wherein the second area is pressed in the direction perpendicular to the first surface.

5. A manufacturing method according to claim 1, wherein the ejection port forming member is not provided to the second area.

* * * * *